United States Patent [19]

Ando

[11] Patent Number: 4,553,630

[45] Date of Patent: Nov. 19, 1985

[54] SPEAKER WITH TWEETER ANGLE ADJUSTING DEVICE

[75] Inventor: Tomiaki Ando, Yamagata, Japan

[73] Assignee: Pioneer Electronic Corporation, Tokyo, Japan

[21] Appl. No.: 692,349

[22] Filed: Jan. 17, 1985

[30] Foreign Application Priority Data

Jan. 19, 1984 [JP] Japan ............................... 59-4606[U]

[51] Int. Cl.[4] ................................................ H05K 5/00

[52] U.S. Cl. .................................... 181/144; 181/141; 179/146 E; 381/86

[58] Field of Search ................................ 181/143-147, 181/141, 150; 179/146 R, 146 E, 115.5 PS; 381/86-90

[56] References Cited

U.S. PATENT DOCUMENTS 4,365,114 12/1982 Soma ............................... 181/144 X 4,441,577 4/1984 Kurihara .......................... 181/141 X

*Primary Examiner*—Benjamin R. Fuller

*Attorney, Agent, or Firm*—Lowe, King, Price & Becker

[57] ABSTRACT

A speaker with a tweeter angle adjusting device, including a woofer; a horizontal shaft supported on the woofer horizontally and rotatably; a horizontal adjusting knob disposed in parallel with and in the same rotating direction as the horizontal shaft, the horizontal adjusting knob being connected to the horizontal shaft through an interlocking mechanism; a tweeter; a tweeter housing which is secured to the horizontal shaft and which supports the tweeter through a vertical shaft rotatably in a direction perpendicular to the horizontal shaft; and a vertical adjusting knob connected to the tweeter through an interlocking mechanism to rotate in the same direction as the tweeter and journalled in a direction perpendicular to the horizontal shaft. The tweeter direction changing operation can be done easily and accurately because the tweeter shifts in the same directions as the turning directions of the horizontal and vertical adjusting knobs. Besides, since the tweeter can shift also in the transverse direction, the improvement of a high frequency range and a satisfactory stereo feeling can be attained.

3 Claims, 3 Drawing Figures

SPEAKER WITH TWEETER ANGLE ADJUSTING DEVICE

BACKGROUND OF THE INVENTION

The present invention relates to a compound speaker suitable for use in a mounted state to a rear tray of a vehicle such as an automobile.

In conventional compound speakers of this type, usually a tweeter is mounted coaxially with a woofer, and so when the tweeter is attached to the rear tray, it faces upward or faces upward in a somewhat forwardly inclined state.

Since the high frequency range which the tweeter takes charge of is strong in directivity, it does not directly reach the listener's ear but a sound reflected by a ceiling or other object is listened to by the ear. Consequently, not only the stereo feeling is weakened and the high frequency range is deteriorated, but also the tone quality is debased by interference caused by reflection, etc.

In order to eliminate such drawbacks, it has recently been proposed to mount a tweeter pivotably on a horizontal shaft and let it face forward to direct sound toward a plane coplanar with the listener's ear.

Even in such compound speaker, however, since the tweeter does not pivot in the right and left directions, it is not improved in the directivity in such directions and the sound will be influenced not only by the reflection characteristics of windows or interior materials but also by the number and position of passenger, thus making it impossible to attain an optimum condition. There occurs deterioration of disturbance in frequency characteristics, particularly in high frequency range, the sound image does not become fixed and a satisfactory stereo feeling is not obtained.

SUMMARY OF THE INVENTION

The present invention has been effected in order to eliminate the above-mentioned drawbacks of the prior art. It is an object of the present invention to attain improvement in the high frequency range and a satisfactory stereo feeling.

It is another object of the present invention to make it possible to adjust the direction of tweeter in a simple and easy manner by disposing tweeter direction adjusting knobs in parallel with the adjusting directions and making the rotational directions of the knobs coincident with the directions in which the tweeter shifts.

BRIEF DESCRIPTION OF THE DRAWINGS

The accompanying drawings illustrate an embodiment of the present invention, in which.

DESCRIPTION OF A PREFERRED EMBODIMENT

Figure 1:
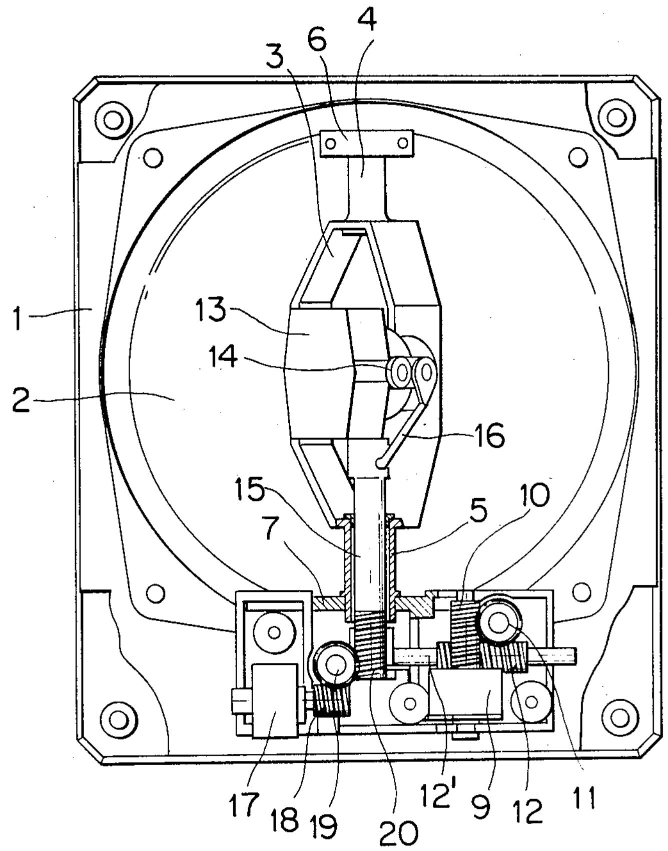
FIG. 1 is a plan view.
Figure 2:
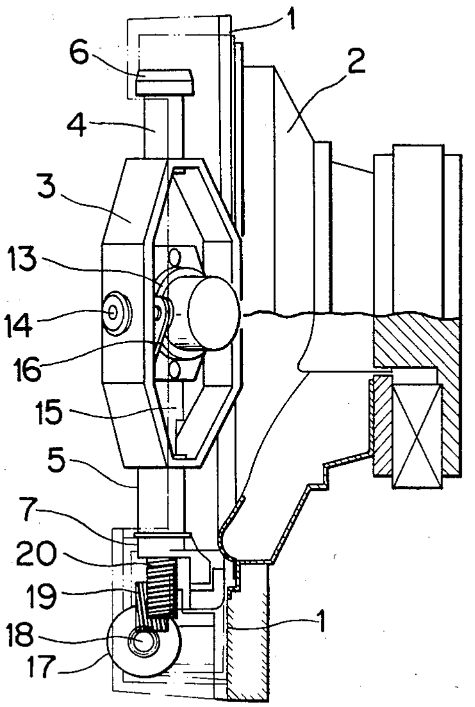
FIG. 2 is a partially cut-away front view.
Figure 3:
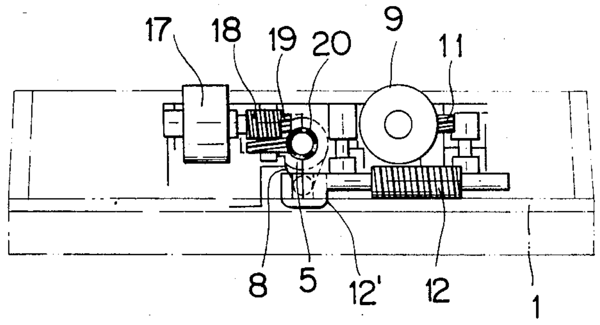
FIG. 3 is a side view of an operating portion.

An embodiment of the present invention will be described hereinunder with reference to FIGS. 1 to 3.

The reference numeral 1 denotes a housing with a woofer 2 secured thereto. The housing 1 is attached to a rear tray of an automobile.

To the housing 1 are fixed bearings 6 and 7 which support horizontal and hollow horizontal shafts 4 and 5 of a tweeter housing 3. A central line joining the shafts

4 and 5 perpendicularly intersects a sound axis of the woofer 2, namely, a vertical central line of the woofer 2.

A crank 8 is provided at one end of the hollow horizontal shaft 5, and by pushing or pulling the fore end of the crank 8 the hollow horizontal shaft 5 and horizontal shaft 4 are pivoted about their axes together with the tweeter housing 3.

A horizontal adjusting knob 9 is journalled in parallel with the axis of the horizontal shaft 4. Integral and coaxial with the horizontal adjusting knob 9 is a worm 10, which is in mesh with a vertically journalled worm gear 11. Further, a horizontal rack 12 is engaged with a gear coaxial with the worm gear 11 and having a cup 12' at an axial end thereof. The crank 8 is engaged with said cup.

In the tweeter housing 3 is supported a tweeter 13 rotatably by a vertical shaft 14 perpendicularly to the foregoing horizontal axis. The sound axis of the tweeter 13 intersects the horizontal axis perpendicularly.

Thus, since the horizontal adjusting knob 9 is journalled in parallel with the horizontal axis, if it is rotated in the direction in which the tweeter 13 is to be shifted, a reduction in speed is made by the engagement between the worm 10 and the worm gear 11 and the gear coaxial with the worm gear 11 causes the rack 12 to perform a linear motion, so that the crank 8 is pushed or pulled. Consequently, the hollow horizontal shaft 5 pivots together with the tweeter housing 3 in the direction in which the horizontal adjusting knob 9 has been rotated, thus causing the tweeter 13 to shift in that direction.

In this case, the sound axis of the tweeter 13 intersects that of the woofer 2 even when the tweeter 13 changes direction because the sound axis of the tweeter 13 perpendicularly intersects the horizontal axis and the latter perpendicularly intersects the sound axis of the woofer 2.

A slide shaft 15 is inserted into the hollow horizontal shaft 5 and to one end thereof is connected one end of a connecting rod 16 which is connected to a rear part of the tweeter 13. As the slide shaft 15 slides axially within the hollow horizontal shaft 5, the connecting rod 16 pushes or pulls the rear part of the tweeter 13, so that the tweeter 13 changes the direction of its sound axis to the right or left about the vertical shaft 14.

A vertical adjusting knob 17 is journalled in a horizontal plane perpendicularly to the horizontal adjusting knob 9, and a worm 18 integral and coaxial with the vertical adjusting knob 17 is in mesh with a worm gear 19 which is vertically journalled and which is in mesh with a cylindrical rack 20 formed at one end of the slide shaft 15.

Thus, the vertical adjusting knob 17 is horizontally disposed perpendicularly to the horizontal adjusting knob 9, so if it is turned in the direction in which the tweeter 13 is to be shifted (namely, to the right or the left), a reduction in speed is made by the engagement between the worm 18 and the worm gear 19 and the worm gear 19 causes the cylindrical rack 20 to perform a linear motion, so that the slide shaft 15 moves axially and the tweeter 13 shifts in a transverse direction as previously noted, which direction can be made coincident with the turning direction of the vertical adjusting knob 17.

Even when the tweeter 13 shifts in a transverse direction, its sound axis does not deviate in that direction with respect to the sound axis of the woofer 2 because both cross each other.

In this way, by turning the horizontal adjusting knob 9 the horizontal shaft 4 and the hollow horizontal shaft 5 are turned together with the tweeter housing 3, thereby permitting the tweeter 13 to shift in the vertical direction, while by turning the vertical adjusting knob 17 the slide shaft 15 is allowed to slide thereby permitting the tweeter 13 to pivot in the transverse direction about the vertical shaft 14 while being held at its shifted angle in the vertical direction. Thus, the direction of the tweeter 13 can be changed suitably in both vertical and transverse directions.

In this case, since the tweeter 13 shifts in the same directions as the turning directions of the horizontal and vertical adjusting knobs 9 and 17, an easy and exact operation can be ensured.

Further, since the sound axis of the tweeter 13 perpendicularly intersects the axes of the horizontal shaft 4 and hollow horizontal shaft 5 and the said axes perpendicularly intersect the sound axis of the woofer 2, both sound axes will never deviate from each other even when the tweeter 13 changes direction.

In the present invention, as set forth hereinabove, the sound axis of the tweeter can be set to any desired vertical and transverse directions, and so where the speaker of the invention is used as a car stereo speaker, the direction of the tweeter for reproducing a high frequency range having a strong directivity can be set to an optimum direction according to high-pitched sound reflecting conditions of vehicular room finishing materials or acoustic conditions of the vehicular room space such as sound reflecting directions of windows and the ceiling, thereby permitting enhancement of the stereo feeling, attenuation of the high frequency range and reduction of interference distortion.

And even when intraroom acoustic conditions are changed by a change in the number and position of passenger or any other cause, such change in the acoustic conditions can be coped with by changing the direction of the tweeter.

Besides, the shaft of the horizontal adjusting knob for changing the vertical direction of the tweeter is parallel to the horizontal shaft which supports the vertical direction of the tweeter, and the vertical adjusting knob for changing the transverse direction of the tweeter is orthogonal to the axial direction of the horizontal adjusting knob, therefore the directions in which the tweeter is to be shifted by those knobs are clear at a glance, that is, the possibility of those knobs being erroneously operated is minimized.

Further, since the turning directions of those knobs are coincident with the turning directions of the tweeter, the knobs may be merely turned in the directions in which the tweeter is to be shifted and thus are extremely easy to operate.

Thus, the tweeter can be easily shifted to any desired direction because of the clearness of the knob operation, thereby permitting the speaker of the invention to be used as a speaker of a vehicular audio system capable of being handled easily by anybody and providing a good quality sound.

What is claimed is:

1. A compound speaker with a tweeter angle adjusting mechanism including
   - a woofer having a sound axis extending in a vertical direction;
   - a horizontal shaft supported on said woofer perpendicularly to said sound axis of the woofer and axially rotatable;
   - a horizontal adjusting knob axially disposed in parallel with and in a same rotating direction as said horizontal shaft, said horizontal adjusting knob being connected to said horizontal shaft through a first interlocking mechanism;
   - a tweeter having a sound axis perpendicular to said horizontal shaft;
   - a tweeter housing which is secured to said horizontal shaft and which supports said tweeter through a vertical shaft rotatably in a direction perpendicular to the horizontal shaft; and
   - a vertical adjusting knob connected to said tweeter through a second interlocking mechanism to rotate in a same direction as the tweeter and journalled in a direction perpendicular to said horizontal shaft.

2. A compound speaker according to claim 1, wherein said first interlocking mechanism includes a worm integral and coaxial with said horizontal adjusting knob, a vertically journalled worm gear in mesh with said worm, a horizontal rack engaged with said vertically journalled worm gear and having a cup at an axial end thereof, and a crank provided at one end of said horizontal shaft, said crank being engaged with said cup.

3. A compound speaker according to claim 1, wherein said horizontal shaft is hollow; said second interlocking mechanism including a worm integral and coaxial with said vertical adjusting knob, a vertically journalled worm gear in mesh with said worm, a cylindrical rack in mesh with said vertically journalled worm gear, a slide shaft to slide axially within said hollow horizontal shaft, and a connecting rod provided between the tweeter and the slide shaft.

* * * * *